United States Patent
Yanagita et al.

(10) Patent No.: US 8,325,254 B2
(45) Date of Patent: Dec. 4, 2012

(54) SOLID-STATE IMAGING DEVICE, METHOD FOR MANUFACTURING THE SAME, AND ELECTRONIC APPARATUS

(75) Inventors: Takeshi Yanagita, Tokyo (JP); Keiji Mabuchi, Kanagawa (JP); Susumu Inoue, Kanagawa (JP)

(73) Assignee: Sony Corporation, Tokyo (JP)

( * ) Notice: Subject to any disclaimer, the term of this patent is extended or adjusted under 35 U.S.C. 154(b) by 325 days.

(21) Appl. No.: 12/604,523

(22) Filed: Oct. 23, 2009

(65) Prior Publication Data
US 2010/0110271 A1     May 6, 2010

(30) Foreign Application Priority Data
Oct. 31, 2008    (JP) ................. 2008-282449

(51) Int. Cl.
*H04N 3/14* (2006.01)
*H04N 5/225* (2006.01)
*H01L 27/146* (2006.01)
*H01L 21/00* (2006.01)

(52) U.S. Cl. ........... 348/294; 348/340; 257/435; 438/73
(58) Field of Classification Search .................. None
See application file for complete search history.

(56) References Cited

U.S. PATENT DOCUMENTS

| | | | | |
|---|---|---|---|---|
| 4,941,029 | A * | 7/1990 | Bluzer ........................ | 257/435 |
| 7,411,620 | B2 * | 8/2008 | Taniguchi et al. ............ | 348/294 |
| 7,989,861 | B2 * | 8/2011 | Kim et al. ..................... | 257/294 |
| 2006/0237629 | A1 * | 10/2006 | Oda ........................ | 250/208.1 |
| 2007/0187794 | A1 * | 8/2007 | Fukuyoshi et al. .......... | 257/440 |
| 2008/0308890 | A1 * | 12/2008 | Uya .............................. | 257/437 |

FOREIGN PATENT DOCUMENTS

| | | |
|---|---|---|
| JP | 2003-031785 | 1/2003 |
| JP | 2005-347709 | 12/2005 |
| JP | 2006-019653 | 1/2006 |

* cited by examiner

*Primary Examiner* — Luong T Nguyen
(74) *Attorney, Agent, or Firm* — SNR Denton US LLP (57) ABSTRACT

A solid-state imaging device includes an effective pixel portion in which a plurality of pixels including photoelectric conversion elements are arrayed; and a nonconductive interpixel light-shielding film that is placed in the effective pixel portion and that shields areas between the pixels.

10 Claims, 10 Drawing Sheets

SOLID-STATE IMAGING DEVICE, METHOD FOR MANUFACTURING THE SAME, AND ELECTRONIC APPARATUS

BACKGROUND OF THE INVENTION

1. Field of the Invention

The present invention relates to a solid-state imaging device, a method for manufacturing the same, and an electronic apparatus.

2. Description of the Related Art

Solid-state imaging devices are broadly classified into amplified solid-state imaging devices represented by CMOS (Complementary Metal Oxide Semiconductor) image sensors and charge-transfer solid-state imaging devices represented by CCD (Charge Coupled Device) image sensors. These types of solid-state imaging devices are widely used in digital still cameras and digital video cameras. In recent years, the CMOS image sensors have often been used as solid-state imaging devices mounted on mobile apparatuses, such as camera-equipped mobile phones or PDAs (Personal Digital Assistants), from the viewpoint of low power supply voltages and power consumption.

So-called back-illuminated CMOS image sensors, in which light enters from a back side of a substrate opposite to a side provided with a multilevel wiring layer, have been suggested (e.g., see Japanese Unexamined Patent Application Publication No. 2003-31785) as solid-state imaging devices and are now under development.

Figure 10:
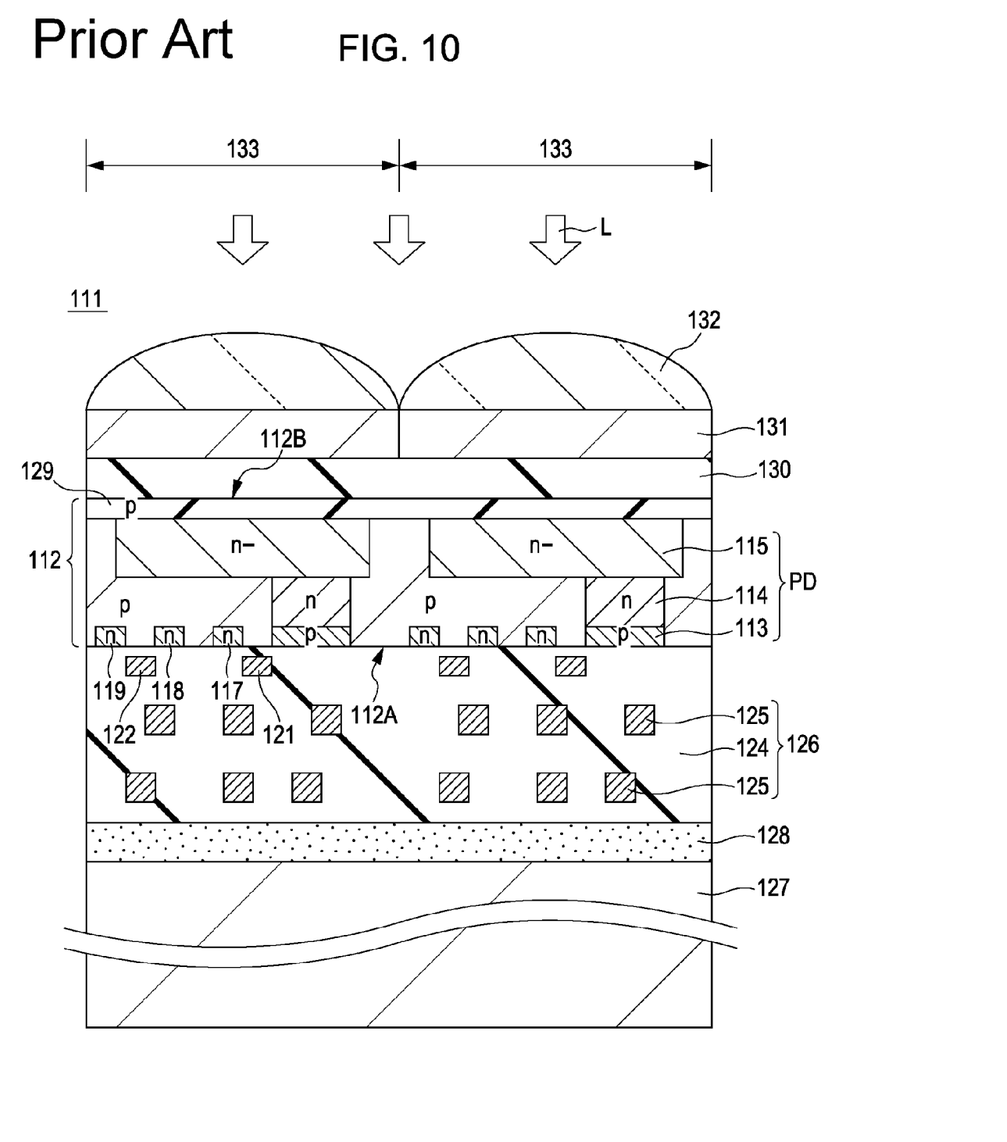
FIG. 10 illustrates a configuration of a main part of another example of a CMOS solid-state imaging device according to a related art.

FIG. 10 illustrates an example of the back-illuminated CMOS solid-state imaging device according to a related art. FIG. 10 is a cross-sectional view of a main part of an imaging region. In FIG. 10, a surface on the side irradiated with incident light L of a silicon portion (corresponding to a semiconductor substrate) 112 is a back surface 112B, and a surface on the opposite side is a front surface 112A.

In the back-illuminated CMOS solid-state imaging device 111, a plurality of pixels including photodiodes PD serving as photoelectric conversion elements and a plurality of pixel transistors are arrayed in the silicon portion 112. On the front surface 112A side of the silicon portion 112, gate electrodes 121 and 122 of the pixel transistors are formed. Also, a multilevel wiring layer 126 including a plurality of wiring layers 125 disposed via an interlayer insulating film 124, and a support substrate 127 are formed. The multilevel wiring layer 126 and the support substrate 127 are bonded via a bonding layer 128. A p-type semiconductor region 129 included in the silicon portion 112 is disposed at the back surface 112B on an interface between the silicon portion 112 and an interlayer insulating film 130. On-chip color filters 131 and on-chip lenses 132 are formed on the interlayer insulating film 130. Reference numeral 133 denotes a unit pixel.

Each of the photodiodes PD includes a p-type semiconductor region 113, an n-type semiconductor region 114 serving as a charge accumulating region, and an n⁻ semiconductor region 115 having a relatively low impurity concentration. Those regions 113 to 115 are disposed in this order from the front surface 112A side to the back surface 112B side of the p-type silicon portion 112. The n⁻ semiconductor region 115 extends to under (above in FIG. 10) a region where the pixel transistors are formed.

In the silicon portion 112, n-type source/drain regions 117, 118, and 119 are formed on the front surface 112A side, and the gate electrodes 121 and 122 are formed via a gate insulating film, whereby a plurality of pixel transistors are formed. The plurality of pixel transistors may be the following three transistors: a transfer transistor; a reset transistor; and an amplification transistor. Alternatively, four transistors may be used by adding a selection transistor.

In the CMOS solid-state imaging device 111, incident light L enters from the upper side of FIG. 10 (from the back surface 112B side), is bent by the on-chip lenses 132 so as to be focused onto the photodiodes PD, and enters the photodiodes PD after color components are separated by the on-chip color filters 131. On receiving the incident light L, the photodiodes PD perform photoelectric conversion thereon.

The incident light L that has entered the vicinity of a border between the pixels 133 passes through the vicinity of a border between the on-chip lenses 132 and enters the silicon portion 112. At the vicinity of the border between the on-chip lenses 132, light passes without being sufficiently bent and photoelectric conversion is performed on the light in that state. Since the photodiodes PD are separated at the vicinity of the border between the pixels 133, photoelectrons produced through photoelectric conversion performed between the photodiodes PD enter any of the photodiodes PD depending on probability.

For example, photoelectrons produced from light that has passed through a green (G) on-chip color filter should ideally enter the photodiode PD under the G on-chip color filter, but actually enter the photodiode PD under an adjoining red (R) or blue (B) on-chip color filter with certain probability. Such a phenomenon where the pixel corresponding to the on-chip color filter through which light has passed is different from the pixel where photoelectrons are detected is called "color mixture", which deteriorates color reproducibility.

The color mixture is significant when light obliquely enters. Depending on an angle, light that has obliquely passed through an edge of the on-chip color filter may enter the photodiode PD of an adjoining pixel.

Figure 8:
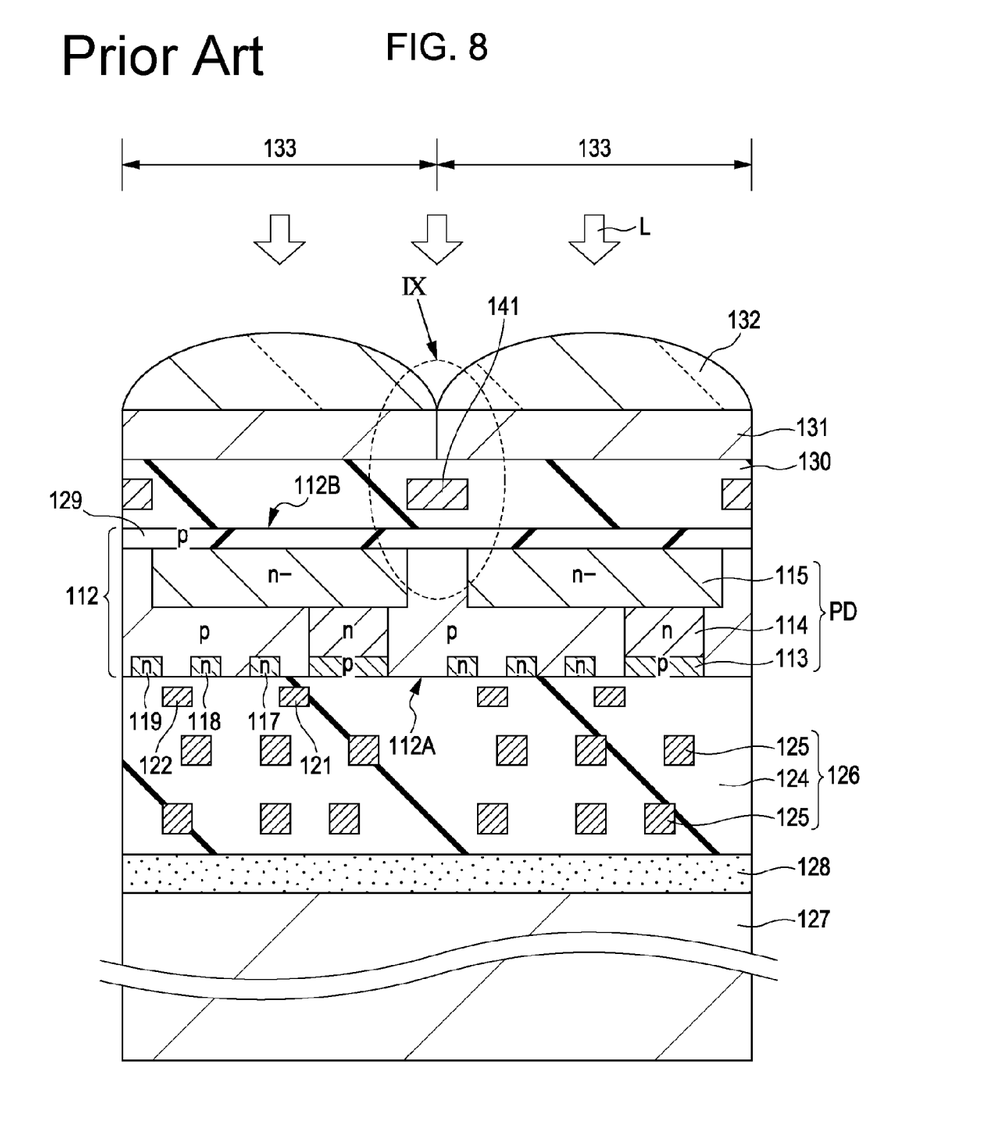
FIG. 8 illustrates a configuration of a main part of an example of a CMOS solid-state imaging device according to a related art.
Figure 9:
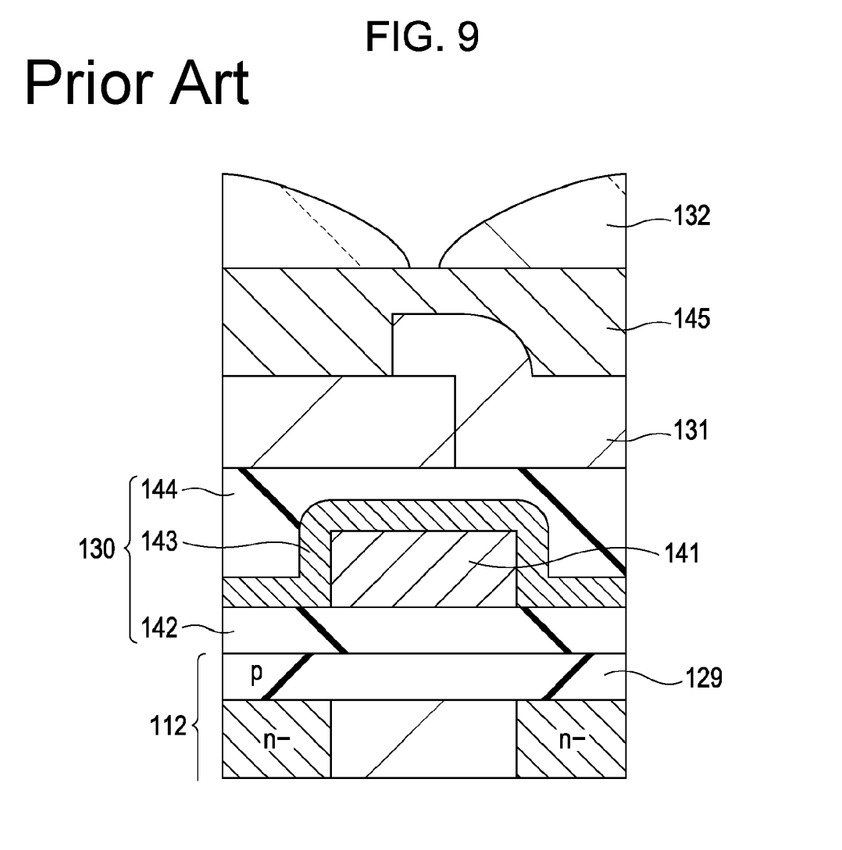
FIG. 9 is an enlarged cross-sectional view of area A illustrated in FIG. 8.

In order to suppress the color mixture, a related art has employed a light-shielding metal 141 placed between the pixels 133, as illustrated in FIG. 8. The light-shielding metal 141 is placed to be embedded in the interlayer insulating film 130. Area IX near the light-shielding metal 141 is illustrated in an enlarged view in FIG. 9. As illustrated in FIG. 9, a silicon dioxide film 142 is formed above the silicon portion 112, a light-shielding metal containing Al or W is formed thereon, and then patterning is performed to produce the interpixel light-shielding metal 141. Furthermore, the light-shielding metal 141 is covered by a silicon-nitride (SiN) film 143 for passivation and spectral adjustment, and a planarizing film 144 including a silicon dioxide (SiO₂) film or an organic film is formed on the SiN film 143. The on-chip color filters 131, an organic planarizing layer 145, and the on-chip lenses 132 are formed on the planarizing film 144.

In many cases, a pixel unit of the CMOS solid-state imaging device 111 includes an optical black (OPB) portion outside an effective pixel portion. The OPB portion is covered by a metal layer (light-shielding metal) and is shielded to detect a black level. In the effective pixel portion other than the OPB portion, the light-shielding metal opens above the photodiodes PD of the pixels and covers the portions between the pixels. Accordingly, incident light L between the pixels is blocked to suppress color mixture.

On the other hand, Japanese Unexamined Patent Application Publication No. 2005-347709 discloses a back-illuminated CMOS solid-state imaging device that has a configuration including an element separating region formed between photodiodes corresponding to an ineffective region between on-chip lenses adjoining to each other. Also, Japanese Unexamined Patent Application Publication No. 2006-19653 discloses a back-illuminated CMOS solid-state imaging device that has a configuration including a metal light-shielding film formed between pixels and in an OPB portion. The metal light-shielding film has a fixed potential.

SUMMARY OF THE INVENTION

In the CMOS solid-state imaging device including the light-shielding metal 141 that shields areas between pixels illustrated in FIG. 8, the sensitivity disadvantageously decreases beyond an area ratio between openings of pixels and an interpixel light-shielding film as the pixels become smaller. The decrease in sensitivity is caused by the following two phenomena.

One is an electrostatic shielding effect resulting from a light-shielding metal. In ordinary cases, the light-shielding metal that shields areas between pixels has a regular grid pattern when viewed in a plan view. Since the light-shielding metal is a conductor, incident light thereto causes electrostatic shielding. That is, change of an electric field of the light causes electrons to move in the light-shielding metal and to absorb light energy, and the light passing through the openings of the pixels is attenuated when the openings are small. Particularly, if an opening width of the pixels is 3 μm or less in smaller pixels, the wavelength of visible light is considerable, and losses due to electrostatic shielding of visible light occur.

The other is a diffraction effect of visible light. If the opening width of pixels is 3 μm or less, the wavelength of visible light is considerable and a diffraction effect of visible light is also considerable, so that a light focusing effect of on-chip lenses is inadequate. Particularly, a decrease in the former is significant.

The light-shielding metal 141 reflects a most part of light applied thereto. Since the interpixel light-shielding metal 141 has a regular grid pattern, reflected light beams interfere with each other and return after being reflected by a camera lens or the like. If the interference light beams are reflected and return, visibly-apparent regular false signals are generated in many cases.

Descriptions have been given above about problems of the light-shielding metal in the back-illuminated CMOS solid-state imaging device, but the same problems arise in a CCD solid-state imaging device when pixels of a reduced size are used.

It is desirable to provide a solid-state imaging device capable of increasing the sensitivity in small pixels and reducing false signals, and a method for manufacturing the solid-state imaging device.

Also, it is desirable to provide an electronic apparatus, such as a camera, including the solid-state imaging device.

A solid-state imaging device according to an embodiment of the present invention includes an effective pixel portion in which a plurality of pixels including photoelectric conversion elements are arrayed; and a nonconductive interpixel light-shielding film that is placed in the effective pixel portion and that shields areas between the pixels.

With this configuration, since the interpixel light-shielding film is made of a nonconductor, light applied to the interpixel light-shielding film is not reflected but is absorbed by the interpixel light-shielding film. The nonconductive interpixel light-shielding film suppresses an electrostatic shielding effect in the interpixel light-shielding film even when pixels of a reduced size are used.

A method for manufacturing a solid-state imaging device according to an embodiment of the present invention includes the steps of forming a nonconductive interpixel light-shielding film over an effective pixel portion and an optical black portion; and forming a conductive light-shielding film above the interpixel light-shielding film in the optical black portion after forming the nonconductive interpixel light-shielding film.

A method for manufacturing a solid-state imaging device according to an embodiment of the present invention includes the steps of forming a conductive light-shielding film in an optical black portion; and forming a nonconductive interpixel light-shielding film in an effective pixel portion after forming the conductive light-shielding film, the conductive light-shielding film and the nonconductive interpixel light-shielding film being at a same height.

With this method, since the interpixel light-shielding film in the effective pixel portion is made of a nonconductor, light applied to the interpixel light-shielding film is not reflected but is absorbed by the interpixel light-shielding film. The nonconductive interpixel light-shielding film suppresses an electrostatic shielding effect. Since the light-shielding film in the optical black portion is made of a conductor, light shielding can be reliably performed.

An electronic apparatus according to an embodiment of the present invention includes a solid-state imaging device; an optical system configured to lead incident light to the solid-state imaging device; and a signal processing circuit configured to process output signals of the solid-state imaging device. The solid-state imaging device includes an effective pixel portion in which a plurality of pixels including photoelectric conversion elements are arrayed and a nonconductive interpixel light-shielding film that is placed in the effective pixel portion and that shields areas between the pixels.

With this configuration including the solid-state imaging device having the nonconductive interpixel light-shielding film, reflection of light does not occur in the interpixel light-shielding film, so that reflection between an imaging lens and the solid-state imaging device can be prevented.

According to the above-described solid-state imaging device, the sensitivity in small pixels can be increased. Also, false signals can be suppressed.

According to the above-described method, a solid-state imaging device with an increased sensitivity in small pixels and suppressed false signals can be manufactured.

According to the above-described electronic apparatus, the sensitivity can be increased and false signals can be suppressed even when pixels of a reduced size are used in the solid-state imaging device. Accordingly, a miniaturized high-quality electronic apparatus can be provided.

DESCRIPTION OF THE PREFERRED EMBODIMENTS

Hereinafter, embodiments of the present invention are described.

Figure 1:
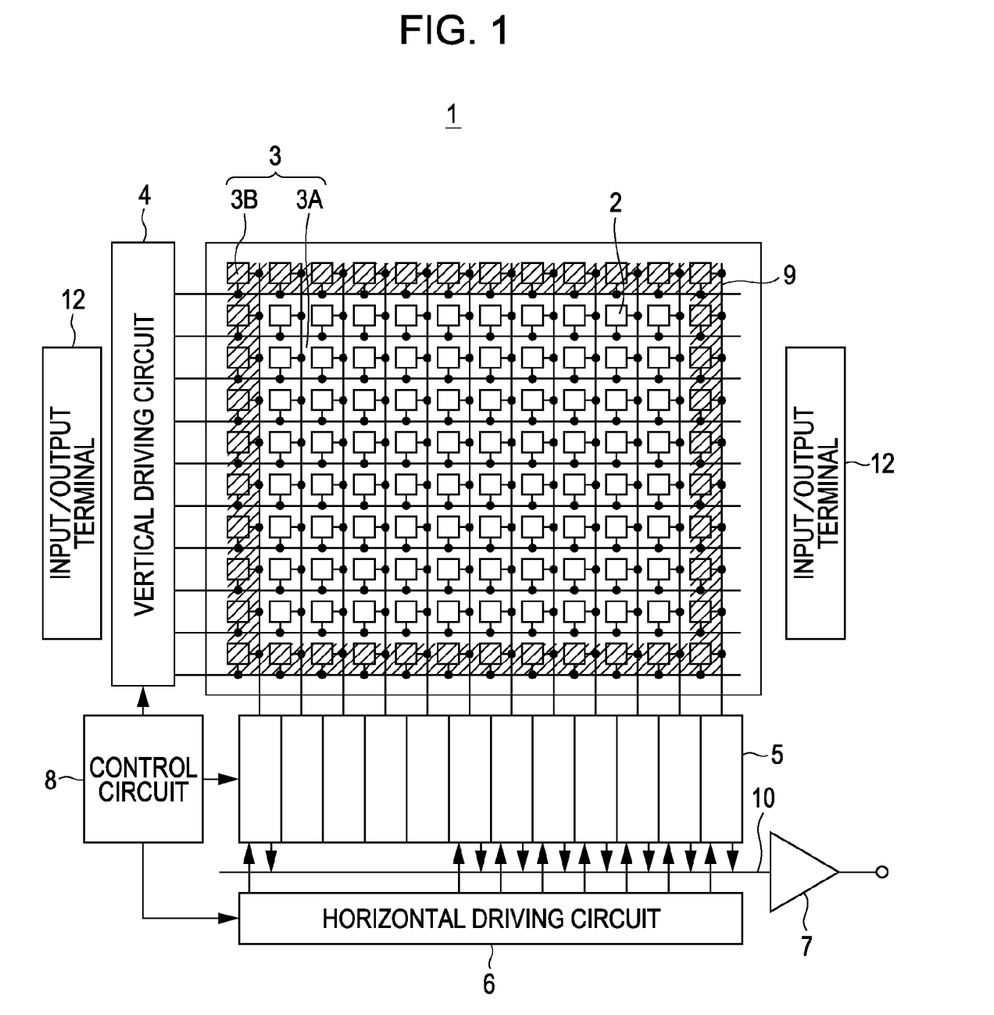
FIG. 1 illustrates a schematic configuration of a solid-state imaging device according to an embodiment of the present invention.

FIG. 1 illustrates a schematic configuration of a CMOS solid-state imaging device according to an embodiment of the present invention. As illustrated in FIG. 1, the solid-state imaging device 1 of this embodiment includes a semiconductor substrate (e.g., a silicon substrate), a pixel unit (a so-called imaging region) 3 in which a plurality of pixels 2 including photoelectric conversion elements are regularly arrayed in two dimensions on the semiconductor substrate, and a peripheral circuit unit. The pixel unit 3 includes an effective pixel portion (a so-called effective imaging region) 3A and a so-called optical black (OPB) portion (a so-called optical black region) 3B (shaded in FIG. 1) positioned outside the effective pixel portion 3A. The OPB portion 3B detects a black level and is covered by a light-shielding film. The pixels 2 include photodiodes (PDs) serving as photoelectric conversion elements and a plurality of pixel transistors (so-called MOS transistors). The plurality of pixel transistors may be the following three transistors: a transfer transistor; a reset transistor; and an amplification transistor. Alternatively, four transistors may be used by adding a selection transistor. An equivalent circuit of a unit pixel is the same as that in an ordinary case.

The peripheral circuit unit includes a vertical driving circuit 4, column signal processing circuits 5, a horizontal driving circuit 6, an output circuit 7, and a control circuit 8.

The control circuit 8 receives an input clock and data for controlling an operation mode, and outputs data including internal information of the solid-state imaging device 1. More specifically, the control circuit 8 generates clock signals and control signals serving as references of operations of the vertical driving circuit 4, the column signal processing circuits 5, the horizontal driving circuit 6, and so forth on the basis of vertical synchronization signals, horizontal synchronization signals, and a master clock. Then, the control circuit 8 inputs those signals to the vertical driving circuit 4, the column signal processing circuits 5, the horizontal driving circuit 6, and so forth.

The vertical driving circuit 4 includes a shift register or the like, selects pixel driving lines, supplies pulses for driving pixels to the selected pixel driving lines, and drives the pixels in units of rows. More specifically, the vertical driving circuit 4 sequentially and selectively scans the respective pixels 2 in the pixel unit 3 in units of rows in the vertical direction, and supplies pixel signals based on signal charge generated in accordance with the amount of received light in the photodiodes PD serving as photoelectric conversion elements of the respective pixels 2 to the column signal processing circuits 5 through vertical signal lines 9.

The column signal processing circuits 5 are placed for the respective columns of the pixels 2, and each of the column signal processing circuits 5 performs signal processing, such as denoising, on signals output from the pixels 2 in a row in units of pixel columns. More specifically, the column signal processing circuits 5 perform signal processing, such as CDS (Correlated Double Sampling) to remove a fixed pattern noise unique to the pixels 2, signal amplification, and AD (Analog-to-Digital) conversion. A horizontal selection switch (not illustrated) is provided in output stages of the column signal processing circuits 5 while being connected between the column signal processing circuits 5 and a horizontal signal line 10.

The horizontal driving circuit 6 includes a shift register or the like, sequentially selects the respective column signal processing circuits 5 by sequentially outputting horizontal scanning pulses, and allows the respective column signal processing circuits 5 to output pixel signals to the horizontal signal line 10.

The output circuit 7 performs signal processing on the signals sequentially supplied from the respective column signal processing circuits 5 through the horizontal signal line 10, and then outputs the signals. For example, the output circuit 7 performs only buffering in some cases, and performs black-level adjustment, column variation correction, and various digital signal processes in other cases. Input/output terminals 12 transmit signals to and receive signals from the outside.

First Embodiment

Exemplary Configuration of Solid-State Imaging Device

Figure 2:
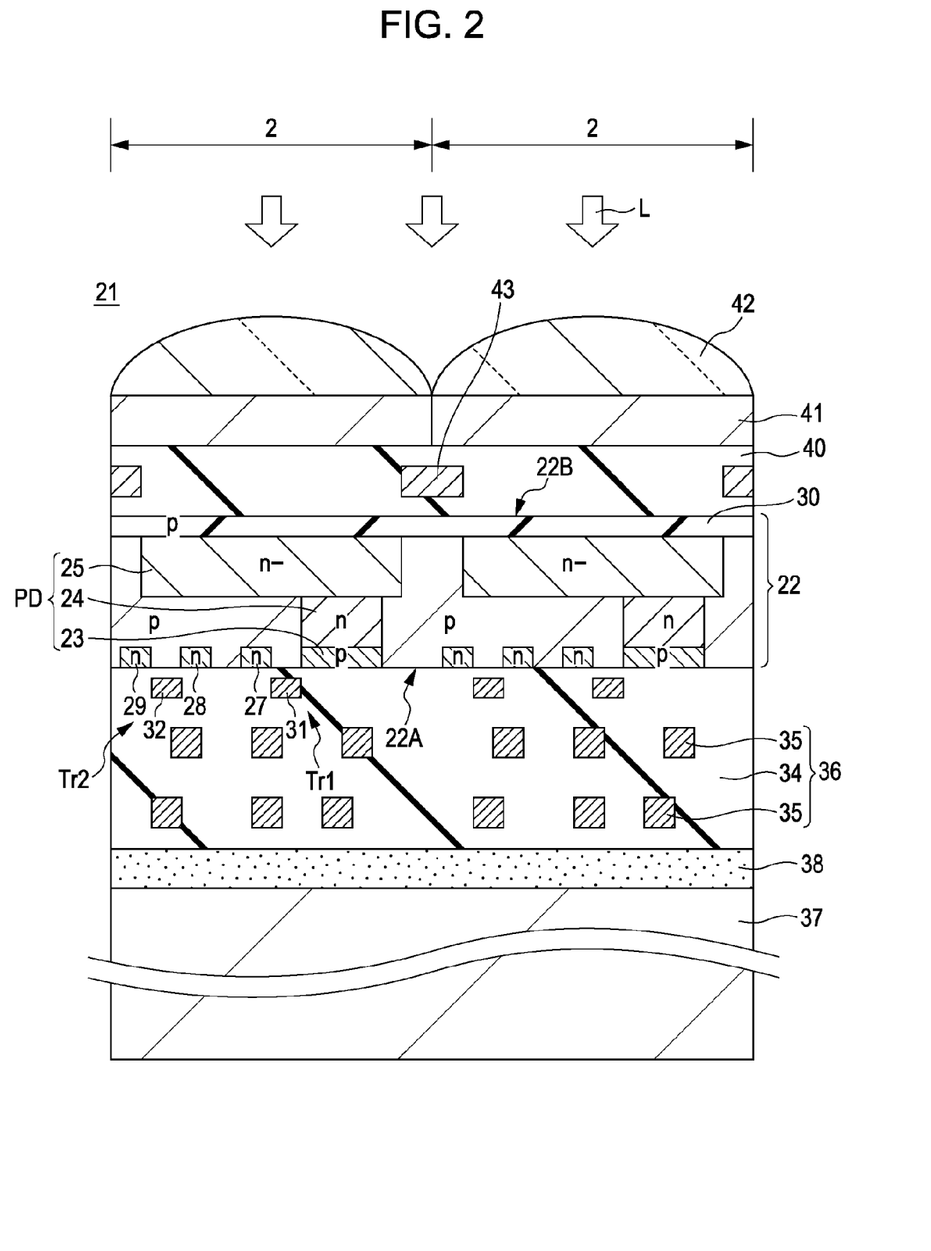
FIG. 2 illustrates a configuration of a main part of a CMOS solid-state imaging device according to a first embodiment of the present invention.

FIG. 2 illustrates a solid-state imaging device 21 according to a first embodiment of the present invention. The solid-state imaging device 21 according to this embodiment is applied to a back-illuminated CMOS solid-state imaging device. FIG. 2 illustrates a main part of the effective pixel portion 3A of the pixel unit 3 illustrated in FIG. 1. In FIG. 2, a surface irradiated with incident light L of a silicon portion 22 is a back surface 22B, and the opposite surface is a front surface 22A.

In the solid-state imaging device 21 according to the first embodiment, a plurality of pixels including photodiodes PD serving as photoelectric conversion elements and a plurality of pixel transistors are arrayed and formed in a two-dimensional matrix pattern in a silicon portion (corresponding to a semiconductor substrate) 22. The silicon portion 22 is a first conductivity type (p-type in this embodiment) silicon portion. On the front surface 22A side of the silicon portion 22, gate electrodes 31 and 32 of the pixel transistors are formed. Also, a multilevel wiring layer 36 including a plurality of wiring layers 35 disposed via an interlayer insulating film 34 is formed. Furthermore, a support substrate 37 is bonded to the multilevel wiring layer 36 via a bonding layer 38.

On the back surface 22B side of the silicon portion 22, on-chip color filters 41 and on-chip lenses 42 are sequentially formed via an interlayer insulating film 40. A p-type semiconductor region 30 included in the silicon portion 22 is disposed at the back surface 22B on an interface between the silicon portion 22 and the interlayer insulating film 40. The p-type semiconductor region 30 is provided for suppressing dark current.

Each of the photodiodes PD includes a p-type semiconductor region 23, an n-type semiconductor region 24 of a second conductivity type serving as a charge accumulating region, and an n⁻ semiconductor region 25 of a lower concentration than the n-type semiconductor region 24. Those semiconductor regions 23 to 25 are disposed in this order from the front surface 22A side to the back surface 22B side of the p-type silicon portion 22. The n⁻ semiconductor region 25 extends to under (above in FIG. 2) a region where the pixel transistors are formed.

A plurality of source/drain regions 27, 28, and 29 are formed on the front surface 22A side of the silicon portion 22, and the gate electrodes 31 and 32 are formed between the source/drain regions forming pairs via a gate insulating film, whereby a plurality of pixel transistors are formed. The plurality of pixel transistors may be the following three transistors: a transfer transistor, a reset transistor, and an amplification transistor. Alternatively, four transistors may be used by adding a selection transistor. In the example illustrated in FIG. 2, as representative, the photodiode PD, the source/drain region 27, and the gate electrode 31 constitute a transfer transistor Tr1. The source/drain region 27 serves as a floating diffusion (FD). The other source/drain regions 28 and 29 and the gate electrode 32 constitute a transistor Tr2. Note that only one transistor Tr2 is illustrated as representative because all of the amplification transistor, reset transistor, and selection transistor have the same configuration.

In this back-illuminated CMOS solid-state imaging device, incident light L enters from the upper side opposite to the multilevel wiring layer 36 (from the back surface 22B side) in FIG. 2, is bent by the on-chip lenses 42 so as to be focused onto the photodiodes PD, and enters the photodiodes PD after color components are separated by the on-chip color filters 41. On receiving the incident light L, the photodiodes PD perform photoelectric conversion thereon.

In this embodiment, an interpixel light-shielding film 43 that shields areas between the adjoining pixels 2 (hereinafter referred to as between pixels) is made of a nonconductor. In this embodiment, the nonconductive interpixel light-shielding film 43 is formed in the interlayer insulating film 40 under the on-chip color filters 41. However, when the OPB portion 3B (see FIG. 1) is provided, a light-shielding film of the OPB portion 3B (described below) is formed by using a metal layer as in an ordinary case. The OPB portion 3B is used to detect a black level and is thus necessary to have a sufficient light-shielding property, e.g., a light transmittance of a millionth. Accordingly, a metal layer is used for the OPB portion 3B. Interpixel light shielding is performed to suppress color mixture, and thus any light-shielding property generates an effect accordingly. For example, the light transmittance may be one severalth in many cases.

Figure 3:
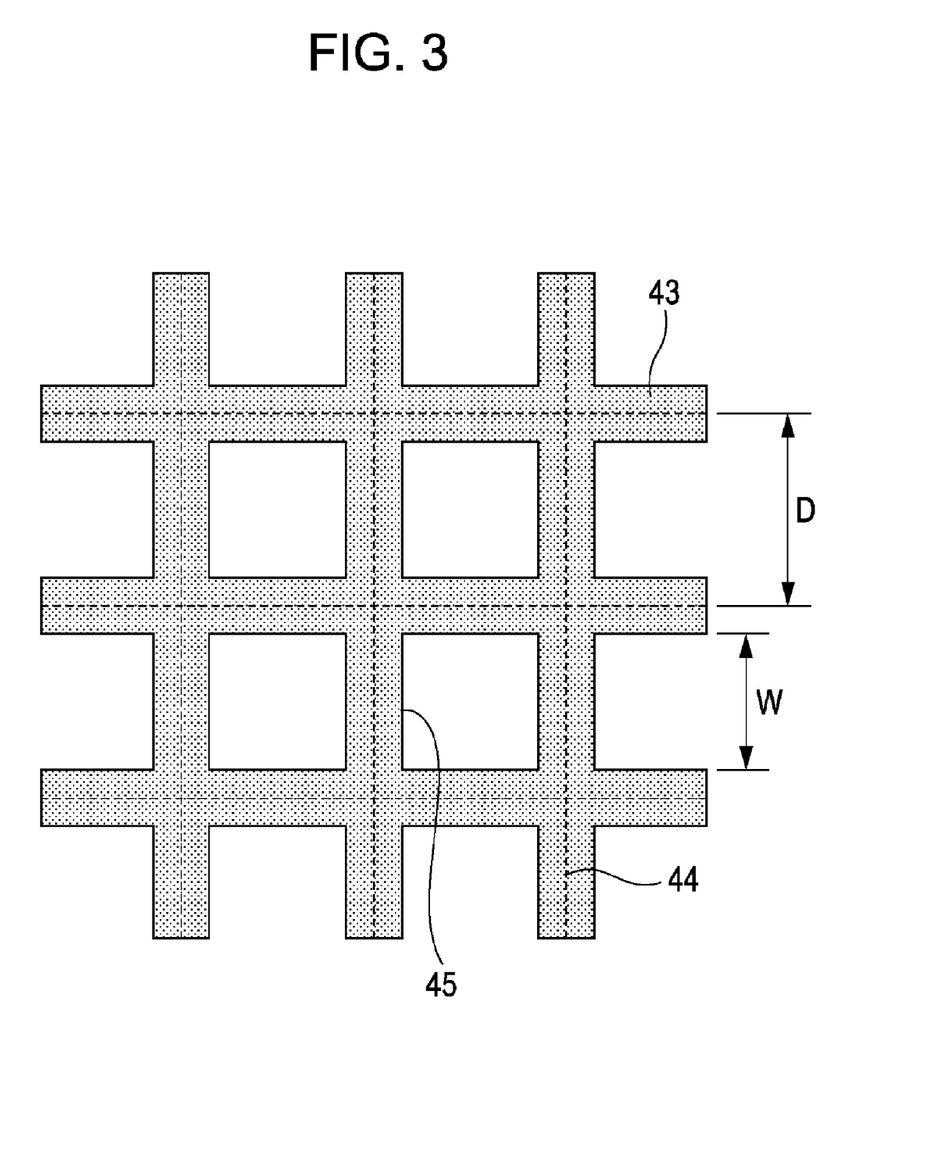
FIG. 3 is a plan view of a nonconductive interpixel light-shielding film according to an embodiment of the present invention.

Here, "between pixels" means "between photodiodes PD", and also means a border of the on-chip color filters 41. The incident side (back surface 22B side) of the photodiodes PD is less susceptible to the array of the pixel transistors Tr1 and Tr2 and thus can be substantially square-shaped. Therefore, the interpixel light-shielding film 43 may be formed in a grid pattern as illustrated in FIG. 3. In FIG. 3, a broken line 44 indicates a border of the pixels 2, reference symbol D denotes a pixel size, reference symbol w denotes a width of an opening of the pixels, that is, an opening width of an opening 45 of the interpixel light-shielding film 43.

Here, as in general classification, a material having an electric conductivity equivalent to that of graphite (electric conductivity of $10^6$ S/m) or more is classified as a conductor, a material having an electric conductivity of $10^{-6}$ S/m or less is classified as an insulator, and a material having intermediate values is classified as a semiconductor. The nonconductor is defined as anything except the conductor, that is, an insulator and a semiconductor. An electric conductivity of $10^6$ S/m is equivalent to an electric current flow with a resistance of 1 Ω in a conductor having a length of 1 meter and a cross-section of 1 mm².

The nonconductive interpixel light-shielding film 43 is preferably made of a nonconductive material that absorbs visible light, for example, an amorphous silicon film. Alternatively, as the nonconductive interpixel light-shielding film 43, a semiconductor film of polysilicon, Ge, GaN, CdTe, GaAs, or Inp; a carbon film having a nonconductive structure; an organic film of black resist or the like; or an organic photoelectric conversion film used in a solar cell can be applied. Any of those materials of a nonconductive film has a property of absorbing visible light, not reflecting it. In the case where an organic film is used as the interpixel light-shielding film 43, the interlayer insulating film thereon is preferably an organic planarizing film.

This embodiment can be applied to a solid-state imaging device including small pixels having an opening width w of 3 μm or less in the trend toward smaller pixels. Furthermore, this embodiment can be applied to smaller pixels having an opening width w of about 1.4 μm or less.

Exemplary Configuration of Interpixel Light-Shielding Film

Figure 4A:
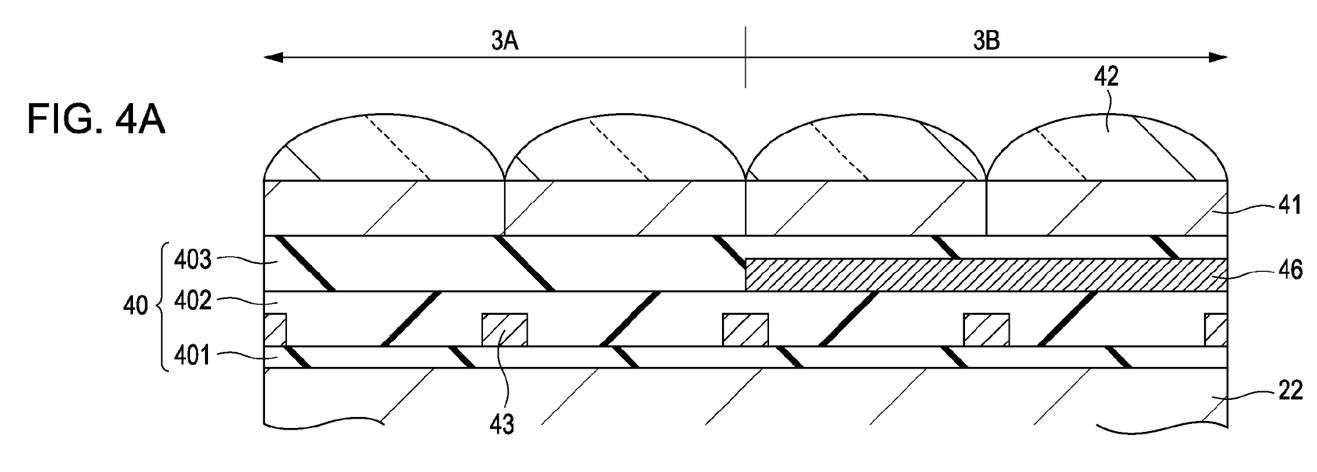
FIGS. 4A and 4B illustrate examples of configurations of an interpixel light-shielding film and a light-shielding film for OPB according to an embodiment of the present invention.

FIGS. 4A and 4B illustrate examples of light-shielding films of the effective pixel portion 3A and the OPB portion 3B of the solid-state imaging device 21 according to this embodiment. In a first example illustrated in FIG. 4A, the interpixel light-shielding film 43 made of a nonconductor, e.g., an amorphous silicon film, is formed over the effective pixel portion 3A and the OPB portion 3B in the interlayer insulating film 40. Furthermore, a light-shielding film 46 made of a conductor, e.g., a metal film, is formed over the entire OPB portion 3B above the interpixel light-shielding film 43 corresponding to the OPB portion 3B. The interpixel light-shielding film 43 and the light-shielding film 46 made of a metal film are formed via the interlayer insulating film 40. The light-shielding film 46 in the OPB portion 3B can be made of a metal film of tungsten (W) or aluminum (Al). An upper surface of the interlayer insulating film 40 is planarized. The on-chip color filters 41 and the on-chip lenses 42 are formed on the planarized interlayer insulating film 40.

In the case where the interpixel light-shielding film 43 is formed also in the OPB portion 3B, the interpixel light-shielding film 43 is preferably formed below the metal light-shielding film 46 for OPB. This is because, in order to appropriately shield areas between pixels from oblique light, it is more effective that the interpixel light-shielding film 43 is closer to the silicon portion 22. The light-shielding film 46 for OPB may be positioned on the upper side because the light-shielding film 46 covers several tens to thousands of pixels with its rough pattern.

Figure 4B:
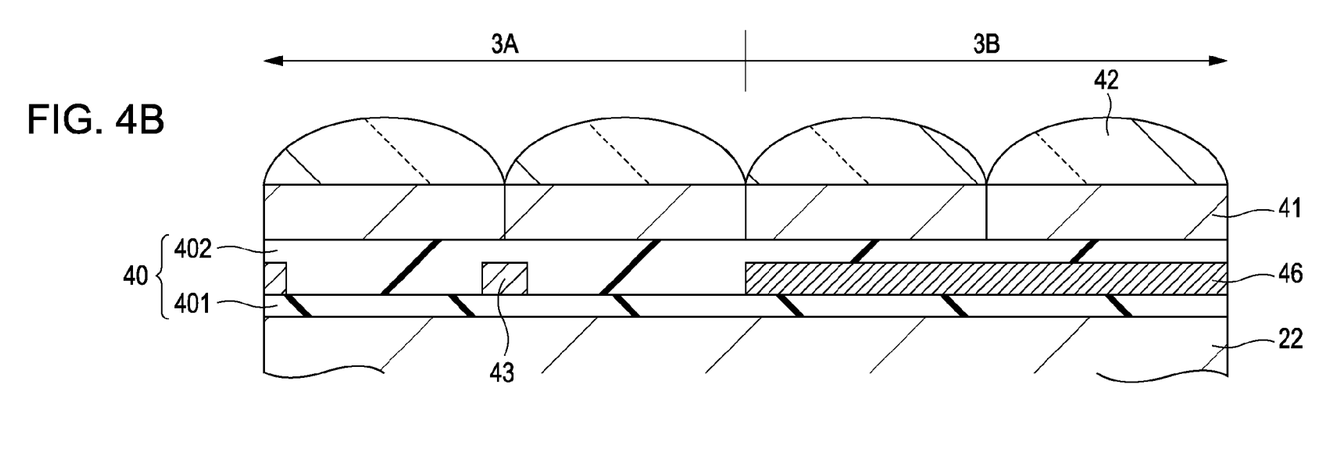

In a second example illustrated in FIG. 4B, the interpixel light-shielding film 43 is not formed on the OPB portion 3B side. That is, the interpixel light-shielding film 43 made of a nonconductor, e.g., an amorphous silicon film, is formed in the region corresponding to the effective pixel portion 3A. Furthermore, the light-shielding film 46 for OPB, made of a conductor such as a metal film, is formed over the entire OPB portion 3B such that the light-shielding film 46 is at the same height as the interpixel light-shielding film 43. The interpixel light-shielding film 43 in the effective pixel portion 3A and the light-shielding film 46 for OPB are formed in the interlayer insulating film 40 as in the above-described case. The on-chip color filters 41 and the on-chip lenses 42 are formed on the planarized interlayer insulating film 40.

Example of Method for Manufacturing Solid-State Imaging Device

Hereinafter, descriptions are given about a method for manufacturing the solid-state imaging device according to this embodiment, particularly about an example of a method for forming the interpixel light-shielding film 43 and the light-shielding film 46 for OPB.

A first example of the manufacturing method (corresponding to the configuration illustrated in FIG. 4A) is described. First, a first interlayer insulating film 401 (see FIG. 4A) made of a silicon dioxide film or the like is formed on the back surface 22B of the silicon portion 22. On the first interlayer insulating film 401, the interpixel light-shielding film 43 made of a nonconductor, e.g., an amorphous silicon film, is formed over the effective pixel portion 3A and the OPB portion 3B. Then, a second interlayer insulating film 402 (see FIG. 4A) made of a silicon dioxide film or the like is formed. On the second interlayer insulating film 402 that is planarized, the light-shielding film 46 for OPB made of a conductor, e.g., a metal film of W or Al, a W film in this example, is formed over the entire OPB portion 3B. Then, a third interlayer insulating film 403 (see FIG. 4A) made of a silicon dioxide film or the like is formed, the upper surface of the third interlayer insulating film 403 is planarized, and the on-chip color filters 41 and the on-chip lenses 42 are formed thereon. In this way, a resulting solid-state imaging device 21 is obtained.

Figure 5A:
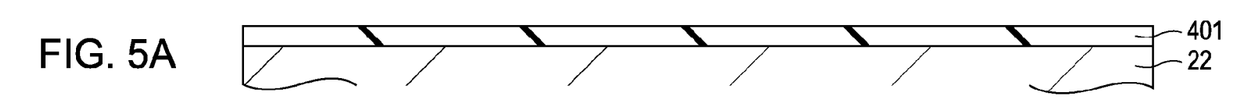
FIGS. 5A to 5E are cross-sectional views illustrating a process of forming an interpixel light-shielding film and a light-shielding film for OPB according to an embodiment of the present invention.
Figure 5B:
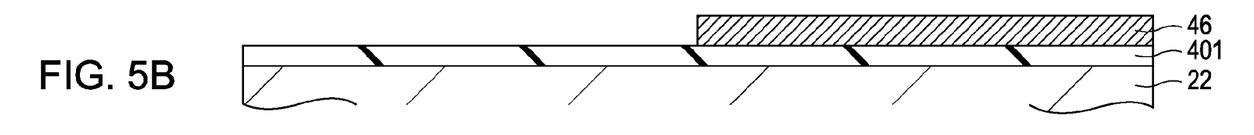

A second example of the manufacturing method (corresponding to the configuration illustrated in FIG. 4B) is described. First, as illustrated in FIG. 5A, a first interlayer insulating film 401 made of a silicon dioxide film or the like is formed on the back surface 22B of the silicon portion 22. Then, the light-shielding film 46 made of a metal film of W or Al, a W film in this example, is formed on the entire upper surface of the first interlayer insulating film 401 and selective etching is performed, whereby the light-shielding film 46 for OPB remains only in the OPB portion 3B, as illustrated in FIG. 5B.

Figure 5C:
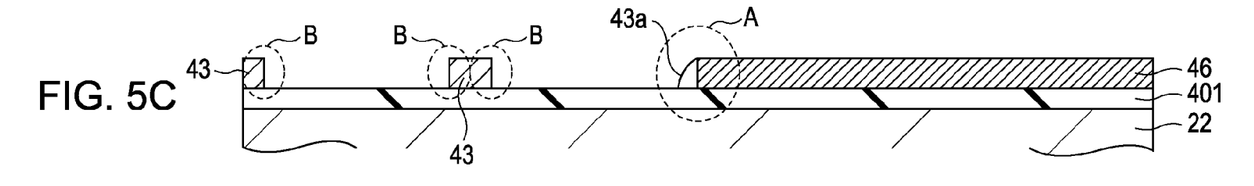

Then, a nonconductor, e.g., an amorphous silicon film, is formed on the entire surface of the first interlayer insulating film 401 in the effective pixel portion 3A and the light-shielding film 46 for OPB. Then, selective etching is performed, so that the interpixel light-shielding film 43 made of an amorphous silicon film is formed in only the region corresponding to the effective pixel portion 3A, as illustrated in FIG. 5C.

At the selective etching of the amorphous silicon film, a side wall 43a as part of the amorphous silicon film remains at a step portion (see area A) at an end of the light-shielding film 46 for OPB. The light-shielding film 46 for OPB is a wide pattern and thus has a step portion only in area A. Thus, the side wall 43a of the amorphous silicon film at this step portion can be easily removed.

In the case where the interpixel light-shielding film 43 made of amorphous silicon is formed and then the light-shielding film 46 for OPB is formed, a step portion of the interpixel light-shielding film 43 exists for each pixel as indicated in areas B. Furthermore, the step portions are close to each other. In this state, it is difficult to remove side walls (residuals) of tungsten (W) formed at the step portions of the interpixel light-shielding film 43.

Figure 5D:
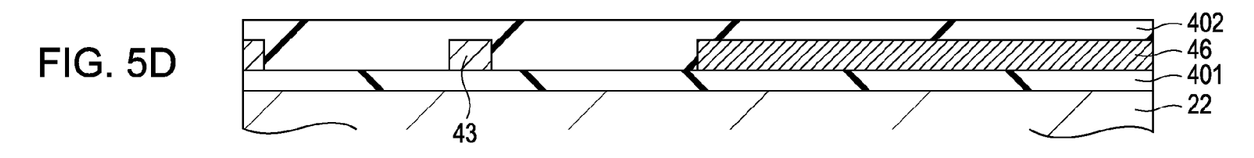

Then, a second interlayer insulating film 402 made of a silicon dioxide film or the like is formed on the entire surface including the effective pixel portion 3A and the OPB portion 3B. Then, the upper surface of the second interlayer insulating film 402 is planarized as illustrated in FIG. 5D.

Figure 5E:
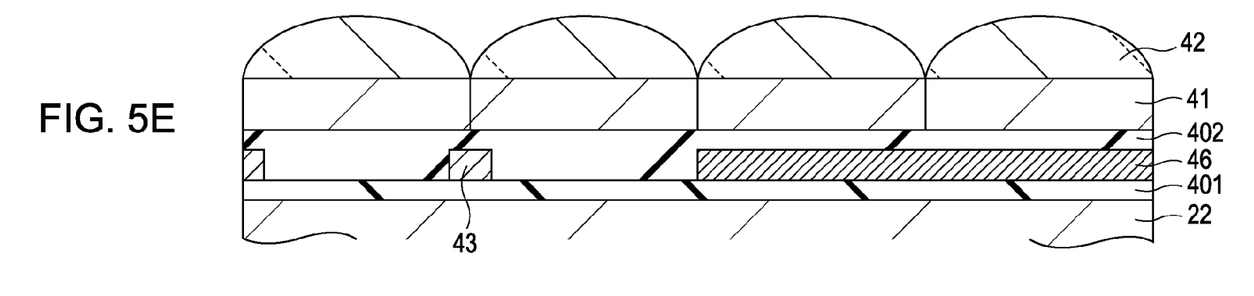

Then, as illustrated in FIG. 5E, the on-chip color filters 41 and the on-chip lenses 42 are formed on the second interlayer insulating film 402, so that a resulting solid-state imaging device 21 is obtained.

In the solid-state imaging device 21 according to the first embodiment, the interpixel light-shielding film 43 in the effective pixel portion 3A is made of a nonconductor, e.g., an amorphous silicon film. With this configuration, visible light applied to the interpixel light-shielding film 43 is absorbed by the interpixel light-shielding film 43 and reflection of the visible light is suppressed. Accordingly, the phenomenon that occurs in the related art, that is, light reflected by an interpixel light-shielding film returns by being reflected by a camera lens or the like, can be suppressed, so that regular and conspicuous false signals due to interference can be reduced. Furthermore, since the interpixel light-shielding film 43 is made of a nonconductor, electrostatic shielding that would occur when the interpixel light-shielding film 43 is made of a conductor does not occur. Therefore, even if the opening width w becomes smaller with the trend toward smaller pixels, attenuation of light passing through an opening due to electrostatic shielding can be prevented.

In the nonconductive interpixel light-shielding film 43, unlike in a metal light-shielding film, visible light passes therethrough, but color mixture is significantly suppressed compared to a case without the interpixel light-shielding film. On the other hand, the light-shielding film 46 for OPB, which is made of a conductor, e.g., a metal film, is capable of reliably blocking visible light and detecting a black level.

As described above, in the solid-state imaging device 21 according to the first embodiment, a decrease in sensitivity due to electrostatic shielding can be suppressed even when pixels of a reduced size are used, particularly even when the opening width of the pixels is 3 μm or less. Accordingly, a highly-sensitive back-illuminated CMOS solid-state imaging device with decreased false signals and suppressed color mixture can be provided.

Additionally, as indicated in the first example illustrated in FIG. 4A, the light-shielding film 46 for OPB is formed above the interpixel light-shielding film 43 in the OPB portion 3B. In such a case where the interpixel light-shielding film 43 is placed below the light-shielding film 46 for OPB, the interpixel light-shielding film 43 is close to the silicon portion 22, so that a shielding effect for oblique light can be obtained and color mixture can be suppressed.

As indicated in the second example illustrated in FIG. 4B, in the case where the interpixel light-shielding film 43 and the light-shielding film 46 for OPB are formed at the same height, the interpixel light-shielding film 43 is close to the on-chip color filters 41. This condition enhances an interpixel shielding effect for oblique light that has passed through the on-chip color filters 41, whereby color mixture is suppressed. In addition, unevenness of a base is less likely to occur when on-chip color filters 41 are formed, so that a difference in level does not occur in the on-chip color filters 41. Furthermore, the distance between the photodiodes PD and the on-chip lenses 42 is shorter than that in the first example illustrated in FIG. 4A, which enhances light focusing efficiency to the photodiodes PD.

In the second example of the method for manufacturing the solid-state imaging device, the light-shielding film 46 for OPB is formed and then the interpixel light-shielding film 43 is formed. With this method, a light-shielding material for OPB does not remain on side walls at step portions of the interpixel light-shielding film 43, which prevents poor sensitivity. This is because, since the light-shielding film 46 for OPB has a rough pattern, step portions resulting from a fine pattern are less likely to occur when the light-shielding film 46 for OPB is formed before the interpixel light-shielding film 43, and thus the material of the interpixel light-shielding film 43 that remains on the side wall at the step portion of the light-shielding film 46 for OPB can be easily removed.

On the other hand, if the interpixel light-shielding film 43 is formed first and then the light-shielding film 46 for OPB is formed, small step portions occur on the interpixel light-shielding film 43 in the respective pixels, and thus it is difficult to completely remove the light-shielding material for OPB that is formed later. If the material of the light-shielding film 46 for OPB remains at a step portion of the interpixel light-shielding film 43, the sensitivity of the corresponding pixel becomes poor.

Second Embodiment

Exemplary Configuration of Solid-State Imaging Device

Figure 6:
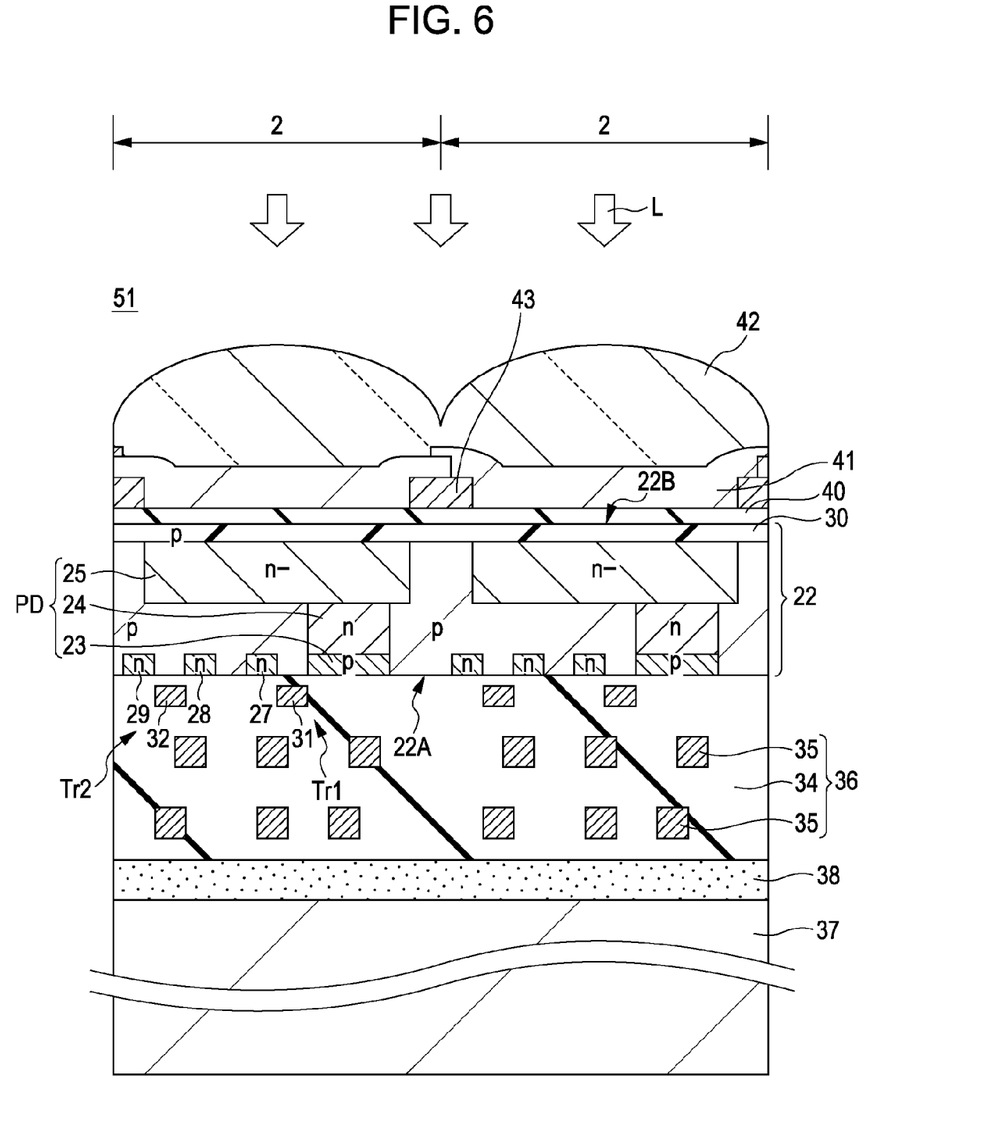
FIG. 6 illustrates a configuration of a main part of a CMOS solid-state imaging device according to a second embodiment of the present invention.

FIG. 6 illustrates a solid-state imaging device 51 according to a second embodiment of the present invention. The solid-state imaging device 51 according to this embodiment is applied to the back-illuminated CMOS solid-state imaging device. FIG. 6 illustrates a main part of the effective pixel portion 3A of the pixel unit 3. In FIG. 6, as in FIG. 1, a surface irradiated with incident light L of the silicon portion 22 is the back surface 22B, and the opposite surface is the front surface 22A.

In the solid-state imaging device 51 according to the second embodiment, the interlayer insulating film 40 is formed on the back surface 22B of the silicon portion 22, the nonconductive interpixel light-shielding film 43 is formed on the interlayer insulating film 40, and the on-chip color filters 41 are directly formed on the interpixel light-shielding film 43 that is not planarized. The on-chip lenses 42 are formed on the on-chip color filters 41. Although not illustrated, the conductive light-shielding film 46 for OPB is formed in the OPB portion 3B.

In the second embodiment, if a step portion exists between the effective pixel portion 3A and the OPB portion 3B, a color filter resist is not smoothly applied thereon, so that uneven application called striation is likely to occur during formation of the on-chip color filters 41. For this reason, the interpixel light-shielding film 43 should be formed at the same height as the light-shielding film 46 for OPB, without being formed in the OPB portion 3B, as illustrated in FIG. 4B. In this case, the on-chip color filters 41 and the interpixel light-shielding film 43 are close to each other, which enhances an interpixel shielding ability particularly for oblique light.

Other than the above-described points, the configuration is the same as that described above with reference to FIG. 2, and thus the parts corresponding to those in FIG. 2 are denoted by the same reference numerals and duplicate descriptions are omitted.

In the solid-state imaging device 51 according to the second embodiment, the interpixel light-shielding film 43 is made of a nonconductor, and thus light applied to the interpixel light-shielding film 43 is absorbed by the interpixel light-shielding film 43, and reflection of the light is suppressed. Also, an electrostatic shielding effect is suppressed in the interpixel light-shielding film 43. Therefore, as in the first embodiment, color mixture can be prevented, the sensitivity can be increased even when pixels of a reduced size are used, and false signals can be reduced.

The configuration according to this embodiment in which the interpixel light-shielding film 43 is made of a nonconductor is effective in the back-illuminated solid-state imaging device. Forming the interpixel light-shielding film by using a nonconductor is nonsense in a front-illuminated CMOS solid-state imaging device. This is because, in the front-illuminated type, light enters through a wiring layer, which is of course made of a conductor. Therefore, even if the interpixel light-shielding film on the uppermost layer is made of a nonconductor, electrostatic shielding occurs in the wiring layer placed thereunder. Additionally, in the front-illuminated type, the interpixel light-shielding film also functions as a wiring layer including a power supply line in many cases.

Third Embodiment

Exemplary Configuration of Solid-State Imaging Device

A solid-state imaging device according to an embodiment of the present invention can be applied to a CCD solid-state imaging device. Although not illustrated, the CCD solid-state imaging device includes a plurality of light receiving units, a CCD-structure vertical transfer register corresponding to columns of the respective light receiving units, a CCD-structure horizontal transfer register, and an output unit. The light receiving units include photodiodes serving as photoelectric conversion elements formed on a semiconductor substrate. The vertical and horizontal transfer registers are formed by arraying a plurality of transfer electrodes in a charge transfer direction in an on-channel region via a gate insulating film. Each light receiving unit and the transfer electrode corresponding to the light receiving unit in the vertical transfer register constitute a unit pixel.

A pixel unit includes an effective pixel portion and an OPB portion that detects a black level. An interpixel light-shielding film is formed in a grid pattern over the effective pixel portion and the OPB portion, and a light-shielding film for OPB is formed over the entire OPB portion. Above the light-shielding film, on-chip color filters and on-chip color lenses are formed via a planarizing film.

In this embodiment, the interpixel light-shielding film is made of the above-described nonconductor, whereas the light-shielding film for OPB is made of a conductor, e.g., a metal film. The configurations of the interpixel light-shielding film and the light-shielding film for OPB can be those illustrated in FIGS. 4A and 4B.

In the solid-state imaging device according to the third embodiment, that is, in the CCD solid-state imaging device, the interpixel light-shielding film is made of a nonconductor, and thus light applied to the interpixel light-shielding film is absorbed by the interpixel light-shielding film, and reflection of the light is suppressed. Furthermore, an electrostatic shielding effect is suppressed in the interpixel light-shielding film. Accordingly, as in the first embodiment, color mixture can be prevented, the sensitivity can be increased even when pixels of a reduced size are used, and false signals can be reduced.

Fourth Embodiment

Exemplary Configuration of Electronic Apparatus

The solid-state imaging devices according to the above-described embodiments of the present invention can be applied to electronic apparatuses, such as a camera including a solid-state imaging device, a mobile apparatus equipped with a camera, and other apparatuses including a solid-state imaging device.

The electronic apparatus according to this embodiment includes, as a basic configuration, a solid-state imaging device, an optical system for leading incident light to the solid-state imaging device, and a signal processing circuit for processing output signals of the solid-state imaging device.

Any of the solid-state imaging devices according to the above-described embodiments is used as the solid-state imaging device.

Figure 7:
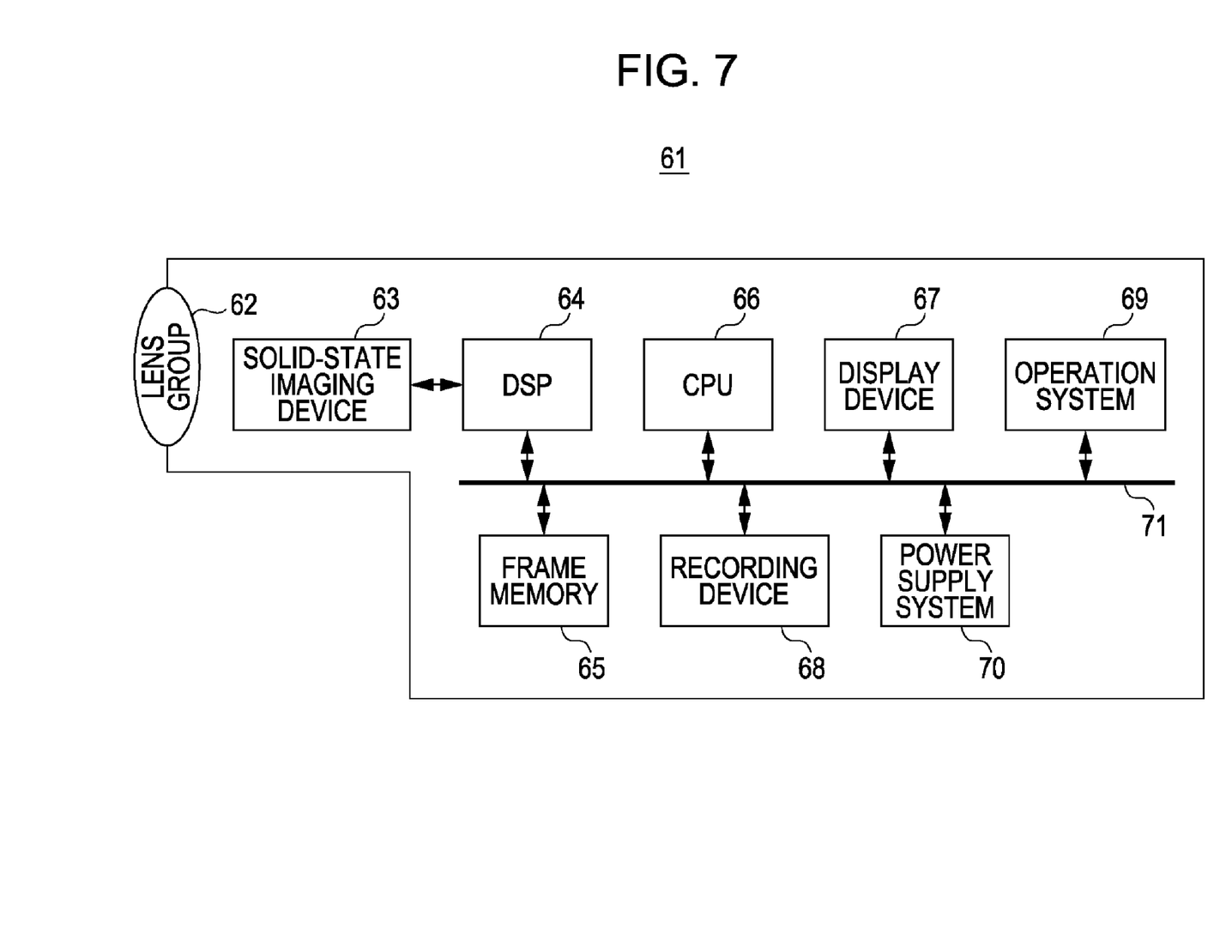
FIG. 7 illustrates a schematic configuration of a camera serving as an electronic apparatus according to a fourth embodiment of the present invention.

FIG. 7 illustrates an embodiment in which the solid-state imaging device is applied to a camera, which is an example of the electronic apparatus according to this embodiment. A camera 61 according to this embodiment includes an optical lens group (optical system) 62, a solid-state imaging device 63, a DSP (Digital Signal Processor) 64, a frame memory 65, a CPU (Central Processing Unit) 66, a display device 67, a recording device 68, an operation system 69, and a power supply system 70. Among these devices, the DSP 64, the frame memory 65, the CPU 66, the display device 67, the recording device 68, the operation system 69, and the power supply system 70 connect to a common bus line 71.

The optical lens group 62 leads image light (incident light) from a subject to an imaging surface (pixel array unit: pixel unit) of the solid-state imaging device 63. Any of the solid-state imaging devices according to the above-described embodiments is applied to the solid-state imaging device 63. The solid-state imaging device 63 converts image light focused on the imaging surface by the optical lens group 62 to electric signals in units of pixels. The DSP 64 controls the solid-state imaging device 63, receives signals therefrom, and generates image signals. The frame memory 65 is a memory that temporarily stores image signals processed in the DSP 64.

The display device 67 displays image signals output as a processing result of the DSP 64. The recording device 68 records the image signals on a magnetic tape, a magnetic disk, an optical disk, or the like. The operation system 69 is used to operate the camera. The power supply system 70 supplies power for driving the solid-state imaging device 63. The CPU 66 controls operations of those devices.

In the solid-state imaging device 63 according to this embodiment of the present invention, the reflectance of an interpixel light-shielding film having a regular pattern is low, which reduces regular false images that occur due to reflection on the optical lens group 62 of light reflected by the interpixel light-shielding film and interference of the reflected light. The solid-state imaging device 63 according to this embodiment is highly sensitive and thus the DSP 64 can generate image signals with reduced noise.

The electronic apparatus according to this embodiment can take the form of a camera module including the optical system 62, the solid-state imaging device 63, the DPS 64, the CPU 66, the frame memory 65, and the power supply system 70 that are modularized.

This embodiment can constitute a camera-equipped mobile apparatus represented by a mobile phone, including the camera module.

Furthermore, the electronic apparatus according to this embodiment can be constituted as a module having the above-described modularized imaging function, a so-called imaging function module. This embodiment can constitute an electronic apparatus including the imaging function module.

In the electronic apparatus, such as the camera 61, according to the fourth embodiment, the sensitivity can be increased and false signals can be suppressed even when pixels of a reduced size are used in the solid-state imaging device, and thus a miniaturized high-quality electronic apparatus can be provided.

The present application contains subject matter related to that disclosed in Japanese Priority Patent Application JP 2008-282449 filed in the Japan Patent Office on Oct. 31, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   an effective pixel portion in which a plurality of pixels including photoelectric conversion elements are arrayed;
   a nonconductive interpixel light-shielding film that is placed in the effective pixel portion and that shields areas between the pixels; and
   an optical black portion in which a conductive light-shielding film is placed,
   wherein,
   the conductive light-shielding film in the optical black portion is formed above the nonconductive interpixel light-shielding film.

2. The solid-state imaging device according to claim 1, wherein the effective pixel portion includes the pixels that include the photoelectric conversion elements and pixel transistors and a conductive wiring layer placed above the pixels, and wherein the photoelectric conversion elements are irradiated with incident light that comes from a side opposite to the conductive wiring layer.

3. The solid-state imaging device according to claim 1, wherein an opening width of the pixels is 3 μm or less.

4. The solid-state imaging device according to claim 1, wherein the nonconductive interpixel light-shielding film includes any of an amorphous silicon film, a polysilicon film, a Ge film, a GaN film, a CdTe film, a GaAs film, an InP film, a carbon film of a nonconductive structure, a black resist film, and an organic photoelectric conversion film.

5. The solid-state imaging device according to claim 1, wherein the nonconductive interpixel light-shielding film and the conductive light-shielding film are formed at a same height.

6. The solid-state imaging device according to claim 1, further comprising:
   an insulating film; and
   color filters formed on the insulating film, wherein the nonconductive interpixel light-shielding film is formed in the insulating film.

7. The solid-state imaging device according to claim 1, further comprising:
   color filters that are in contact with the nonconductive interpixel light-shielding film, wherein the nonconductive interpixel light-shielding film is formed on an insulating film.

8. An electronic apparatus comprising:
   a solid-state imaging device;
   an optical system configured to lead incident light to the solid-state imaging device; and
   a signal processing circuit configured to process output signals of the solid-state imaging device, wherein the solid-state imaging device includes an effective pixel portion in which a plurality of pixels including photoelectric conversion elements are arrayed and a nonconductive interpixel light-shielding film that is placed in the effective pixel portion and that shields areas between the pixels;
   the solid-state imaging device further including an optical black portion in which a conductive light-shielding film is placed, wherein the conductive light-shielding film in the optical black portion is formed above the nonconductive interpixel light-shielding film.

9. The electronic apparatus according to claim 8, wherein the effective pixel portion of the solid-state imaging device includes the pixels that include the photoelectric conversion elements and pixel transistors, and a conductive wiring layer placed above the pixels, and wherein the photoelectric conversion elements are irradiated with incident light that comes from a side opposite to the conductive wiring layer.

10. The electronic apparatus according to claim 8, wherein the nonconductive interpixel light-shielding film in the solid-state imaging device includes any of an amorphous silicon film, a polysilicon film, a Ge film, a GaN film, a CdTe film, a GaAs film, an InP film, a carbon film of a nonconductive structure, a black resist film, and an organic photoelectric conversion film.

* * * * *